(12) United States Patent
Carducci et al.

(10) Patent No.: US 11,043,360 B2
(45) Date of Patent: Jun. 22, 2021

(54) GAS DISTRIBUTION PLATE ASSEMBLY FOR HIGH POWER PLASMA ETCH PROCESSES

(71) Applicant: Applied Materials, Inc., Santa Clara, CA (US)

(72) Inventors: James D. Carducci, Sunnyvale, CA (US); Kenneth S. Collins, San Jose, CA (US); Kartik Ramaswamy, San Jose, CA (US); Michael R. Rice, Pleasanton, CA (US); Richard Charles Fovell, San Jose, CA (US); Vijay D. Parkhe, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 218 days.

(21) Appl. No.: 15/414,379

(22) Filed: Jan. 24, 2017

(65) Prior Publication Data
US 2017/0365443 A1 Dec. 21, 2017

Related U.S. Application Data

(60) Provisional application No. 62/350,598, filed on Jun. 15, 2016.

(51) Int. Cl.
*H01J 37/32* (2006.01)

(52) U.S. Cl.
CPC .... *H01J 37/32009* (2013.01); *H01J 37/3244* (2013.01); *H01J 37/3255* (2013.01); *H01J 2237/334* (2013.01)

(58) Field of Classification Search
CPC ............ H01J 37/32009; H01J 37/3244; H01J 37/3255; H01J 2237/334
See application file for complete search history.

(56) References Cited

U.S. PATENT DOCUMENTS

| | | | |
|---|---|---|---|
| 2002/0123230 A1 | 9/2002 | Hubacek | |
| 2005/0241766 A1* | 11/2005 | Dhindsa | H01J 37/32009 156/345.34 |
| 2009/0163034 A1* | 6/2009 | Larson | H05K 13/00 438/729 |

(Continued)

FOREIGN PATENT DOCUMENTS

| | | | | |
|---|---|---|---|---|
| CN | 101005727 A | | 7/2007 | |
| CN | 101657565 A | * | 2/2010 | ............ C23C 16/30 |

(Continued)

OTHER PUBLICATIONS

Samsung Newsroom, Eight Major Steps to Semiconductor Fabrication, Part 1: Creating the Wafer, Apr. 22, 2015, accessed Dec. 10, 2019 from https://news.samsung.com/global/eight-major-steps-to-semiconductor-fabrication-part-1-creating-the-wafer (Year: 2015).*

(Continued)

*Primary Examiner* — Kelly M Gambetta
(74) *Attorney, Agent, or Firm* — Patterson + Sheridan, LLP

(57) ABSTRACT

A gas distribution plate assembly for a processing chamber is provided that in one embodiment includes a body made of a metallic material, a base plate comprising a silicon infiltrated metal matrix composite coupled to the body, and a perforated faceplate comprising a silicon disk coupled to the base plate by a bond layer.

18 Claims, 9 Drawing Sheets

(56) References Cited

U.S. PATENT DOCUMENTS

| | | | |
|---|---|---|---|
| 2009/0197423 A1* | 8/2009 | Koshimizu | H01J 37/32009 438/719 |
| 2013/0087286 A1 | 4/2013 | Carducci et al. | |
| 2013/0288037 A1* | 10/2013 | Sun | H01J 37/32082 428/312.8 |
| 2013/0315795 A1* | 11/2013 | Bera | B01J 19/26 422/310 |
| 2014/0209027 A1 | 7/2014 | Lubomirsky et al. | |

FOREIGN PATENT DOCUMENTS

| | | | |
|---|---|---|---|
| JP | 2007194507 A * | 8/2007 | |
| JP | 2007194507 A | 8/2007 | |
| JP | 2007535816 A | 12/2007 | |
| JP | 2008108796 A | 5/2008 | |
| JP | 20130087286 A | 5/2013 | |
| JP | 2016056410 A | 4/2016 | |
| JP | 2016511935 A | 4/2016 | |
| KR | 10 20070016142 A | 2/2007 | |
| KR | 10 20070077048 A | 7/2007 | |
| KR | 10-20130037168 A | 4/2013 | |
| KR | 10-20150109463 A | 10/2015 | |
| KR | 20160044102 A | 4/2016 | |
| TW | 201012309 A | 3/2010 | |
| WO | WO-2014198134 A1 * | 12/2014 | C23C 16/45565 |

OTHER PUBLICATIONS

International Search Report and Written Opinion for Application No. PCT/US2016/068276 dated Mar. 20, 2017.

Japanese Office Action for Application No. JP 2018-565719 dated Dec. 17, 2019.

Taiwan Office Action for Application No. 106101809 dated Feb. 14, 2020.

Korean Office Action for Application No. 10-2018-7037686 dated Feb. 20, 2020.

Taiwan Office Action for Application No. 106101809 dated Apr. 29, 2020.

Korean Office Action for Application No. 10-2018-7037686 dated Oct. 28, 2020.

* cited by examiner

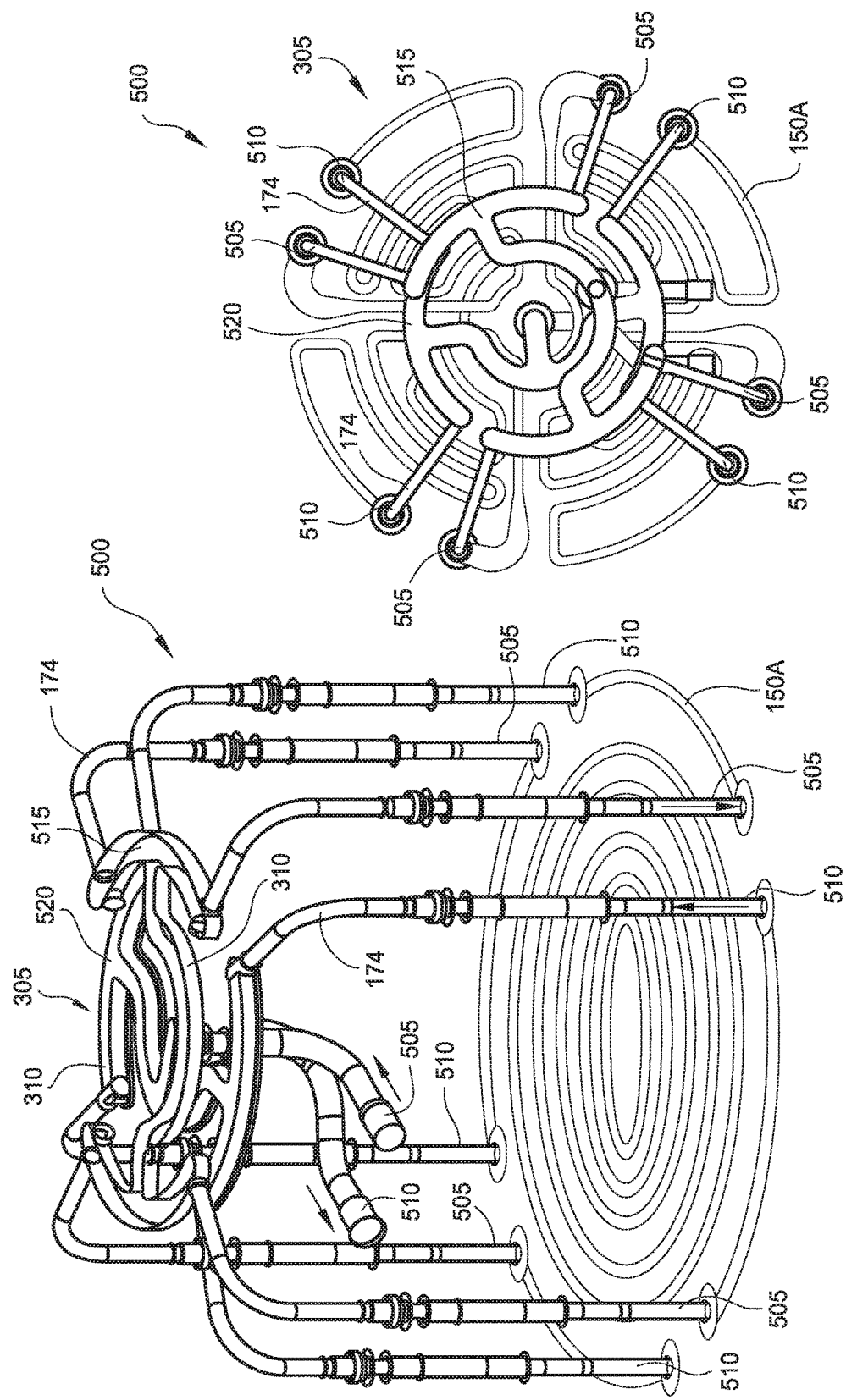

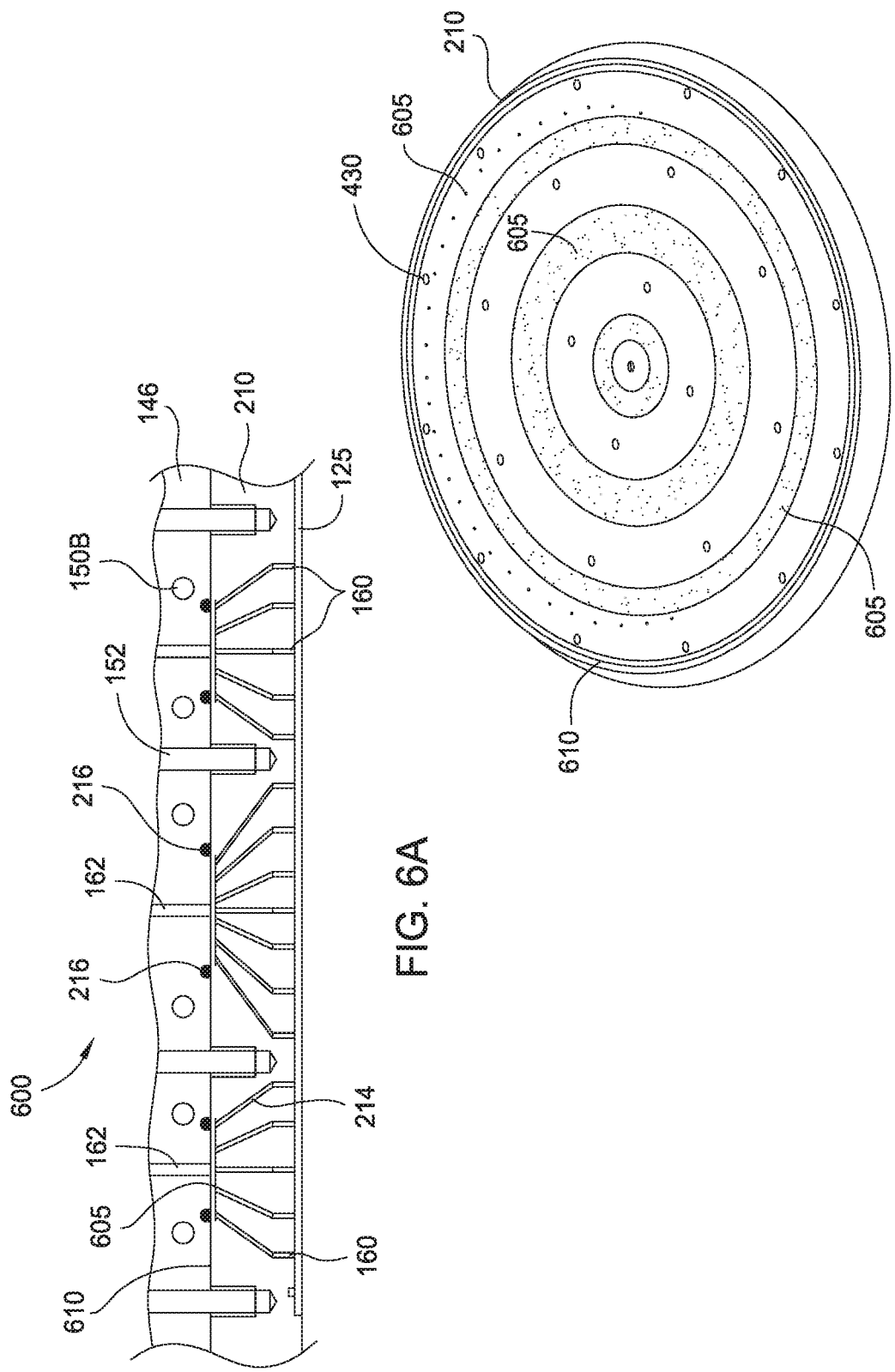

GAS DISTRIBUTION PLATE ASSEMBLY FOR HIGH POWER PLASMA ETCH PROCESSES

BACKGROUND

Field

Embodiments of the present disclosure generally relate to semiconductor processing equipment. More particularly, embodiments of the present disclosure relate to a gas distribution plate assembly that may be used in plasma processes.

Description of the Related Art

Integrated circuits have evolved into complex devices that can include millions of components (e.g., transistors, capacitors, resistors, and the like) on a single chip. The evolution of chip designs requires faster circuitry as well as greater circuit density, and the demand for greater circuit density necessitates a reduction in the dimensions of the integrated circuit components. The minimal dimensions of features of such devices are commonly referred to in the art as critical dimensions. The critical dimensions generally include the minimal widths of the features of the circuit structure, such as lines, spaces between the lines, columns, openings, and the like.

As these critical dimensions shrink, process uniformity across the substrate becomes important in order to maintain high yields. One problem associated with a conventional plasma etch process used in the manufacture of integrated circuits is the non-uniformity of the etch rate across the substrate, which may be due, in part, to temperature variations of components utilized in the etch process, such as a gas distribution plate assembly. This non-uniformity may significantly affect performance and increase the cost of fabricating integrated circuits.

New apparatuses and methods are needed to more precisely control temperature of a gas distribution plate assembly.

SUMMARY

A gas distribution plate assembly for a processing chamber is provided that in one embodiment includes a body made of a metallic material, a base plate comprising a silicon infiltrated metal matrix composite coupled to the body, and a perforated faceplate comprising a silicon disk coupled to the base plate by a bond layer.

The gas distribution plate assembly includes a body, a perforated faceplate comprising a silicon disk coupled to the body, and a bond layer disposed between the body and the perforated faceplate.

In another embodiment, a processing chamber is provided that includes a gas distribution plate assembly. The gas distribution plate assembly comprises a base plate comprising a metal matrix composite, and a perforated faceplate comprising a silicon disk coupled to the base plate by a bond layer. The processing chamber also includes a temperature control system coupled to the gas distribution plate assembly.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 5A is an isometric view of one embodiment of a recursive fluid system that may be used with the gas distribution plate assembly of FIG. 1 or the gas distribution plate assembly of FIG. 2.

FIG. 5B is a plan view of the recursive fluid system of FIG. 5A.

FIG. 6A is a schematic cross-sectional view of a portion of a gas distribution plate assembly showing on embodiment of branch conduits formed in a base plate.

FIG. 6B is an isometric top view of the base plate of FIG. 6A.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the disclosure provide a gas distribution plate assembly that may be used in a processing chamber for any number of substrate processing techniques is provided. The gas distribution plate assembly is particularly useful for performing a plasma assisted dry etch process that requires both heating and cooling of the substrate surface without breaking vacuum. The gas distribution plate assembly may be utilized in etch chambers available from Applied Materials, Inc. of Santa Clara, Calif., but may also be suitable for use in chambers for performing other types of plasma processes as well as chambers available from other manufacturers.

Figure 1:
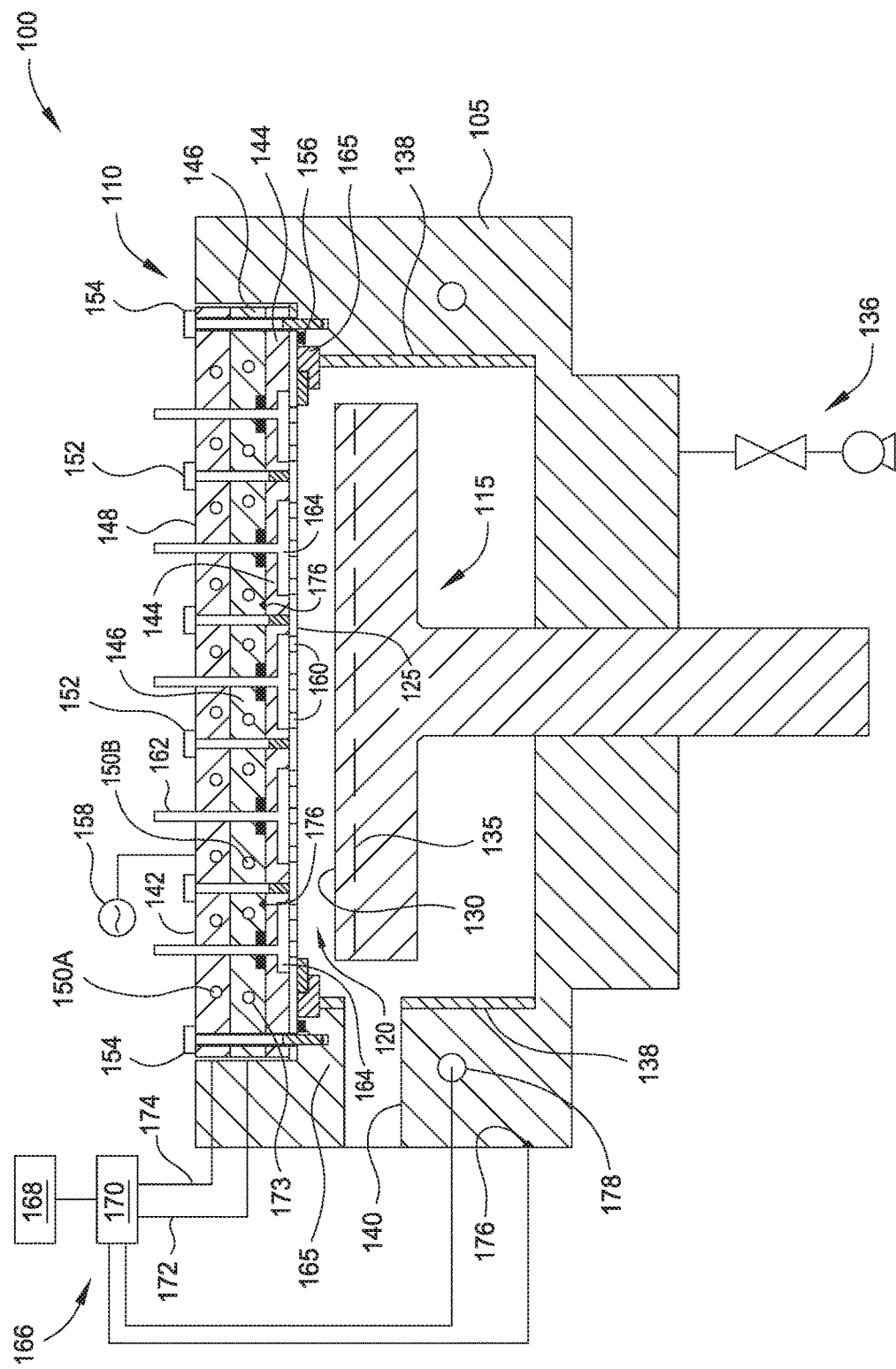
FIG. 1 is a partial cross-sectional view showing an illustrative processing chamber.

FIG. 1 is a partial cross-sectional view showing an illustrative processing chamber 100. In one embodiment, the processing chamber 100 includes a chamber body 105, a gas distribution plate assembly 110, and a support assembly 115. The chamber body 105 of the processing chamber 100 may be formed from one or more process-compatible materials, such as aluminum, anodized aluminum, nickel plated aluminum, nickel plated aluminum 6061-T6, stainless steel, as well as combinations and alloys thereof, for example. The support assembly 115 may function as an electrode in conjunction with the gas distribution plate assembly 110 such that a plasma may be formed in a processing volume 120 defined between a perforated faceplate 125 and an upper surface 130 of the support assembly 115. The support assembly 115 may be a vacuum chuck, an electrostatic chuck, or other type of substrate support that may be made of conductive material, such as aluminum. Alternatively, the support assembly 115 may be made of a ceramic material and include an embedded electrode 135 for electrostatic chucking, biasing the plasma, or other use. The chamber body 105 may also be coupled to a vacuum system 136 that includes a pump and a valve. A liner 138 may also be disposed on surfaces of the chamber body 105 in the processing volume 120.

The chamber body 105 includes a port 140 formed in a sidewall thereof. The port 140 is selectively opened and closed to allow access to the interior of the chamber body 105 by a substrate handling robot (not shown). A substrate (not shown) can be transferred in and out of the processing chamber 100 through the port 140 to an adjacent transfer chamber and/or load-lock chamber, or another chamber within a cluster tool. The support assembly 115 may be movable relative to the chamber body 105. A substrate (not shown) may be disposed on the upper surface 130 of the support assembly 115 for processing. The support assembly 115 may be in a position adjacent to the port 140 for substrate transfer. The support assembly 115 may also move to a position in proximity to the perforated faceplate 125 for processing. The support assembly 115 may also be rotatable relative to the chamber body 105. Lift pins (not shown) may also be used to space the substrate away from the upper surface 130 of the support assembly 115 to enable exchange with the substrate handling robot during substrate transfer.

The gas distribution plate assembly 110 includes a body 142. The body 142 is coupled to the perforated faceplate 125 by a bond layer 144. The bond layer 144 may be an organic adhesive in some embodiments. In this embodiment, the body 142 includes one or more plate members 146, 148 that include thermal control conduits 150A and 150B formed therein. The plate members 146 and 148 may be made of a conductive material, such as aluminum, and are coupled to each other by fasteners 152 such that a metal to metal contact between the plate members 146 and 148 is provided. The body 142 and the perforated faceplate 125 may be coupled to the chamber body 105 by fasteners 154. A seal 156, such as an elastomeric o-ring, may be disposed between the body 142 and the chamber body 105 to seal the processing volume 120 as well as electrically insulate the body 142 from the chamber body 105. A radio frequency (RF) power source 158 may be coupled to one or both of the body 142 or the perforated faceplate 125 to electrically bias the gas distribution plate assembly 110 relative to the support assembly 115.

The perforated faceplate 125 includes a plurality of openings 160 that are coupled to a plurality of gas conduits 162 to provide a gas to the processing volume 120. In this embodiment, the gas conduits 162 are formed through the plate members 146 and 148 to a distribution channel 164 formed in the bond layer 144. The perforated faceplate 125 may be made of silicon utilized in integrated circuit manufacture, such as a silicon disk or a silicon wafer utilized in electronic device manufacture. The perforated faceplate 125 may be any size and include any suitable surface area but, in one embodiment, the perforated faceplate 125 is a 450 millimeter (in diameter) silicon wafer. The silicon material of the perforated faceplate 125 may be doped or un-doped to provide enhanced conductive or dielectric properties.

The openings 160 may be formed using suitable hole forming techniques such as etching or laser drilling. In one embodiment, the openings 160 are formed by a through silicon via (TSV) process. In one embodiment, the diameter of each of the openings may be about 50 microns ($\mu m$) to about 64 $\mu m$. The openings 160 may be numerous in relation to the surface area of the perforated faceplate 125 (i.e., dense) to maximize flow conductance and/or minimize pressure in the distribution channels 164. One or more of the size of the openings 160 and the density of the openings 160 reduce the possibility of plasma light-up in the distribution channels 164 or other portions of the body 142. A shield 165 may be positioned between the liner 138 and the perforated faceplate 125. The shield 165 may be made of quartz, or another process resistant material.

Utilizing a silicon wafer for the perforated faceplate 125 provides a replaceable consumable element of the gas distribution plate assembly 110. For example, as plasma may erode surfaces of the perforated faceplate 125 over time. When eroded, the perforated faceplate 125 may be decoupled from the body 142 and a new perforated faceplate 125 may be bonded thereto. The use of a standard size silicon wafer thus decreases cost of ownership as the perforated faceplate 125 may be replaced with another when necessary at a much lower cost as compared to replacement of the entire gas distribution assembly 110.

In some embodiments, the thermal control conduits 150A and 150B are operably coupled to a temperature control system 166. The temperature control system 166 includes a system controller 168 and a temperature controller 170. The temperature controller 170 is coupled to heater leads 172 that are coupled to the thermal control conduits 150B. The thermal control conduits 150B may contain a resistive heater 173 or heaters in some embodiments. The temperature controller 170 is also coupled to the thermal control conduits 150A by tubing 174. The tubing 174 and the thermal control conduits 150A may be adapted to flow a coolant, such as a heat transfer fluid, therein. The temperature control system 166 may also include temperature sensors 176 that are in communication with the temperature controller 170. The temperature sensors 176 may be positioned within the body 142 to monitor temperature of the body 142 of the gas distribution plate assembly 110. Each of the temperature sensors 176 may be a thermocouple or other device that provides a metric of temperature of the gas distribution plate assembly 110 to the temperature controller 170. In some embodiments, the chamber body 105 may include a temperature control conduit 178 that is coupled to the temperature controller 170. A temperature sensor 176 may be used to monitor temperature of the chamber body 105 and provide a metric of the temperature to the temperature controller 170. The temperature controller 170 may include servo controllers that control electrical power to the resistive heater 173 and flow control of fluids to the thermal control conduits 150A (and the temperature control conduit 178, when utilized).

In operation, a set-point temperature for the gas distribution plate assembly 110 may be provided by the system controller 168 to the temperature controller 170. Based on feedback from the temperature sensors 176, the temperature controller 170 may provide heating (e.g., via the resistive heater 173), or provide cooling (e.g., via the thermal control conduits 150A) in order to provide and/or maintain the gas distribution plate assembly 110 at a set-point temperature. Thus, a closed loop temperature control is provided by the temperature control system 166.

In one example of operation, the temperature control system 166 provides two modes of temperature control. The first mode is provided when plasma is induced by the RF power source 158 ("plasma-on"). When in the plasma-on state, the main heat load to the gas distribution plate assembly 110 is from the heat created by the plasma in the processing volume 120. The remaining heat load is provided by the resistive heater 173 in the gas distribution plate assembly 110. During plasma-on, in the first mode, the power applied to the resistive heater 173 is about 10% to about 20% power to maintain temperature set-point control. In a second mode, when plasma is tolled ("plasma-off"), the heater power is increased up to about 80% to about 90% to maintain the temperature set-point. For additional temperature control, the temperature control system 166 may include a low flow mode and high flow mode for the thermal control conduits 150A. The low flow for plasma-off condition enables reduced heater power to maintain temperature set-point, and high flow for plasma-on may reduce the temperature of the gas distribution plate assembly 110 from the heat of the plasma. The temperature controller 170 may utilize a flow control valve and a proportional-integral-derivative controller (PID controller) in a closed loop with the temperature set-point and readings from the temperature sensors 176 in the gas distribution plate assembly 110. Coolant flow rate and heater power may be servo controlled to maintain temperature set-point.

Embodiments of the temperature control system 166 can be used to provide uniform temperature of the gas distribution plate assembly 110 during cycling between the plasma-on state and the plasma-off state. In some conventional chambers, there may be a temperature delta of about 30 degrees Celsius at the interface of the gas distribution plate and the processing volume. The first and second modes of the temperature controller 170 may be used to maintain a set point temperature in both of the plasma-on and plasma-off states. Maintenance of the set-point temperature may result in more stable within substrate processing as well as substrate to substrate processing. In this manner, temperature control of the gas distribution plate assembly 110, and processing temperature, is reliably controlled. Embodiments of the gas distribution plate assembly 110 as described herein may be reliably utilized in high power dielectric etch process (e.g., about 20 kilowatt total RF power). Embodiments of the temperature control system 166 as described herein may be utilized to maintain a set-point temperature of about 120 degrees Celsius to about 160 degrees Celsius.

Figure 2:
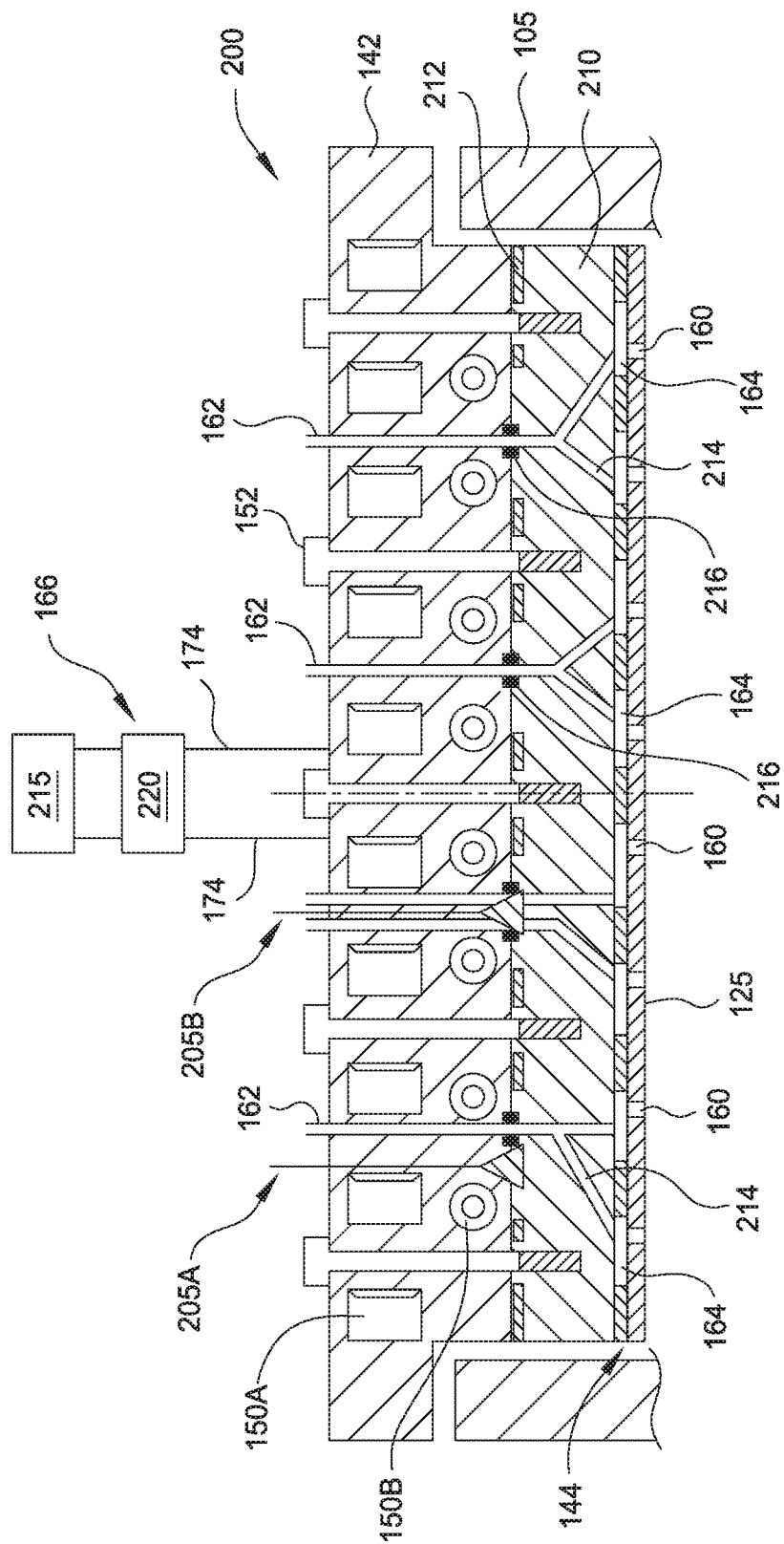
FIG. 2 is a schematic cross-sectional view of another embodiment of a gas distribution plate assembly that may be utilized in the processing chamber of FIG. 1.

FIG. 2 is a schematic cross-sectional view of another embodiment of a gas distribution plate assembly 200 that may be utilized in the processing chamber 100 of FIG. 1. The gas distribution plate assembly 200 includes a plurality of temperature sensors, such as an outer zone temperature sensor 205A and an inner zone temperature sensor 205B. The gas distribution plate assembly 200 is similar to the gas distribution plate assembly 110 as shown in FIG. 1 with the following exceptions. The body 142 of the gas distribution plate assembly 200 is a unitary (one-piece) member but may be two plates as shown in FIG. 1. Other differences include a base plate 210 coupled between the body 142 and the perforated faceplate 125.

The base plate 210 in this embodiment may be made of a silicon infiltrated metal matrix composite. Examples of the material of the base plate 210 include reaction bonded ceramic materials having silicon (Si) at varying quantities with silicon carbide (SiC) as a major component thereof (i.e., SiSiC). Si content (volume %) of the base plate 210 may be about 20 to about 30 with the remainder being SiC. Examples of materials include Grade SSC-702, Grade SSC-802 and Grade SSC-903 available from M Cubed Technologies, Inc. of Newtown, Conn.

The base plate 210 may be secured directly to the body 142 by fasteners 152 to ensure good thermal contact therebetween. Depending on thermal conductivity, in an alternative embodiment, a thermal gasket 212 may be disposed between the body 142 and the base plate 210. The bond layer 144, which secures the perforated faceplate 125 to the base plate 210, may be a diffusion bond in this embodiment. The base plate 210 and the perforated faceplate 125 may have a similar thermal conductivity which may provide thermal communication between the body 142 and the perforated faceplate 125 in order to control temperature of the gas distribution plate assembly 200.

The gas conduits 162 may be formed through the body 142 and at least a portion of which include branch conduits 214. The branch conduits 214 serve to transport gases through the base plate 210 to the distribution channels 164 and/or the openings 160 in the perforated faceplate 125. The distribution channels 164 and the branch conduits 214 as well as extensions of the gas conduits 162 in the base plate 210 may be formed in a green body of the base plate 210 prior to sintering. For example, any grooving or holes may be machined or otherwise formed in the green body of the base plate 210 and filled with carbon that is later burned off after sintering. Alternatively, the distribution channels 164 and the branch conduits 214 as well as extensions of the gas conduits 162 in the base plate 210 may be formed by machining after sintering of the base plate 210. Seals 216, such as o-rings, may be used to prevent leakage of gases at the interface of the base plate 210 and the body 142.

In this embodiment, the gas distribution plate assembly 200 is coupled to the temperature control system 166 which includes a fluid treatment device 215. The fluid treatment device 215 may be a heat exchanger or a chiller that controls the temperature of fluids provided to the thermal control conduits 150A. The fluid treatment device 215 may be coupled to the thermal control conduits 150A by the tubing 174. In some embodiments, the temperature control system 166 includes a water facility interface box 220 having temperature controlled water that is provided to the gas distribution plate assembly 200 (as well as other portions of the processing chamber 100 (shown in FIG. 1). The tubing 174 according to this embodiment (as well as the embodiment of FIG. 1) are recursive. Recursive may be defined as the equal splitting of coolant lines (i.e., tubing 174), for example, from one conduit into two conduits, two conduits into four conduits, four conduits into eight conduits, eight conduits into sixteen conduits, and so on. Additionally, each leg of the split is same length, hydraulic diameter, and shape, so each leg has the same flow conductance. The recursive conduits provide uniform temperature on the perforated faceplate 125 as well as providing the same flow rate in the cooling quadrants (four cooling regions in one embodiment).

Figure 3:
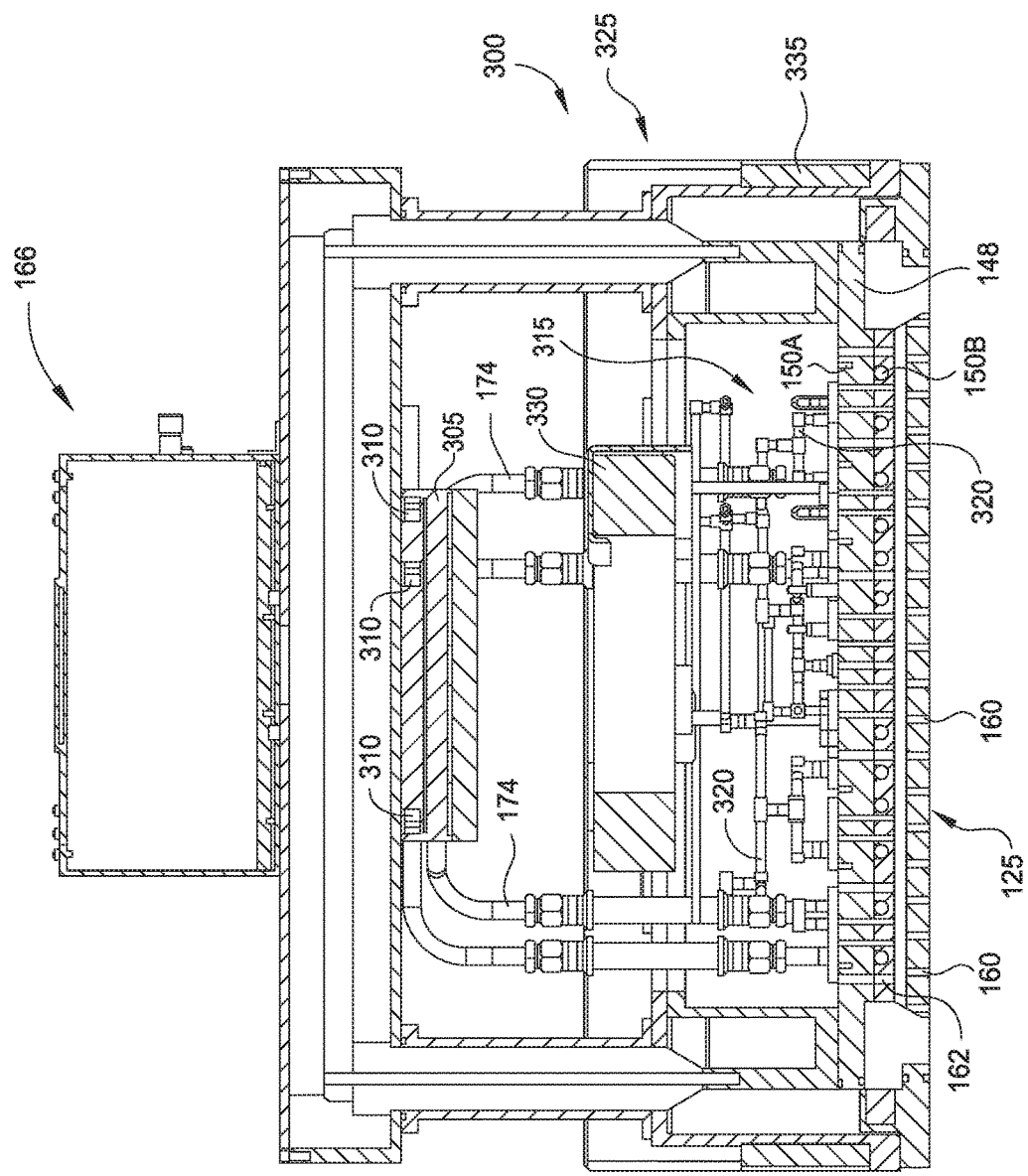
FIG. 3 is a cross-sectional view of the temperature control system that may be used with the gas distribution plate assembly of FIG. 1 or the gas distribution plate assembly of FIG. 2.

FIG. 3 is a cross-sectional view of the temperature control system 166 that may be used with the gas distribution plate assembly 110 of FIG. 1 or the gas distribution plate assembly 200 of FIG. 2. The temperature control system 166 may be part of a lid assembly 300 that may be coupled to the processing chamber 100 of FIG. 1 with either of the gas distribution plate assembly 110 or the gas distribution plate assembly 200 of FIG. 2.

The lid assembly 300 includes a coolant plate 305 that includes a plurality of recursive coolant channels 310 that are coupled to the tubing 174. The tubing 174 is coupled to the plate member 148 which includes the thermal control conduits 150A. The lid assembly 300 also includes a process gas distribution system 315 which includes a plurality of gas lines 320. A portion of the gas lines 320 are coupled to the plate member 148 and the gas conduits 162 for flowing process gas to the openings 160 in the perforated faceplate 125.

In one embodiment, the lid assembly 300 includes a magnet assembly 325 that includes one or both of a central or first magnet 330 and a peripheral or second magnet 335. The magnet assembly 325 may be a cusp type magnet system that creates a B-field with peak fields in the center of the chamber. The magnet assembly 325 may be used to tune the etch rates. For example, the ratio of the inner to outer coil currents may be used for tuning. RF frequency of about 162 MHz tends to be a center peaked plasma (highest plasma density at the center of the chamber), and the magnets may be utilized to push the plasma outward which reduces the center peak plasma. In some embodiments, lower RF frequencies (e.g., about 60 MHz) may not need magnets to tune the plasma.

Figure 4C:
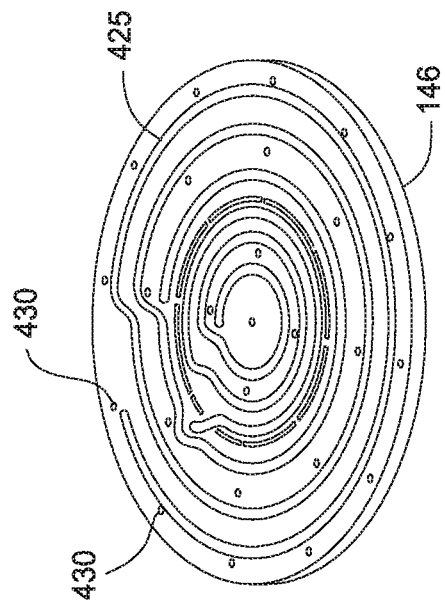
FIG. 4C is an isometric view of the plate member having a plurality of channels formed therein.
Figure 4B:
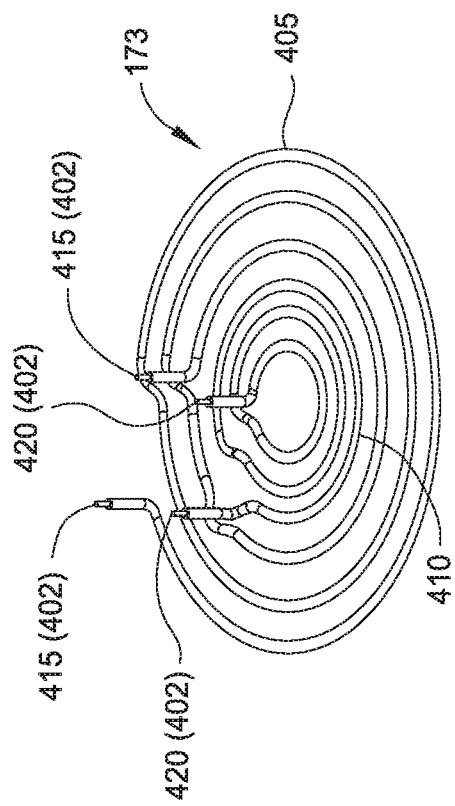
FIG. 4B is an isometric view of the resistive heater according to one embodiment.
Figure 4A:
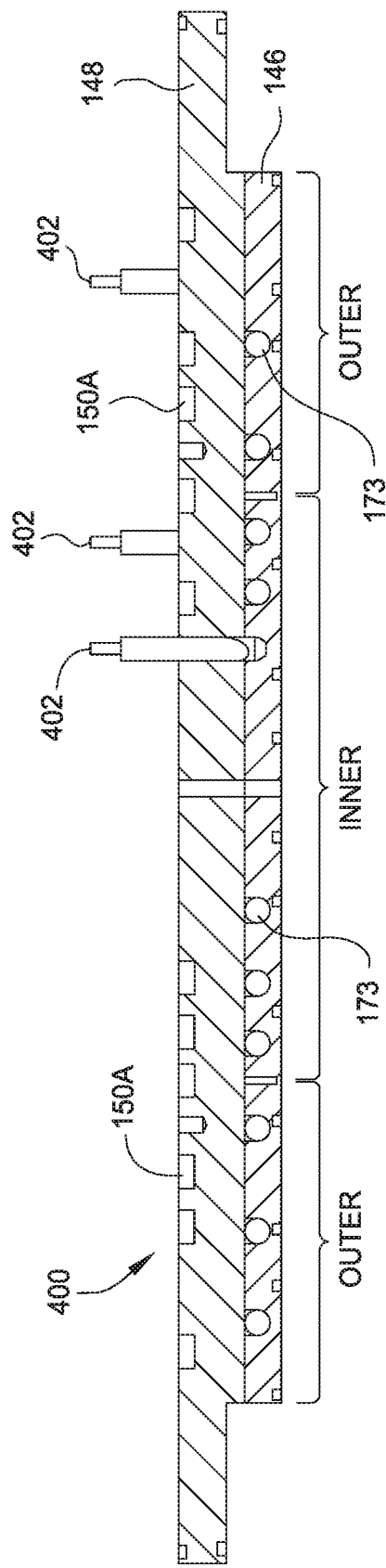
FIG. 4A is a cross-sectional view of a portion of a gas distribution plate assembly.

FIGS. 4A and 4B are various views of a resistive heater 173 that may be used in the gas distribution plate assembly 110 of FIG. 1 or the gas distribution plate assembly 200 of FIG. 2. FIG. 4A is a cross-sectional view of a portion of a gas distribution plate assembly 400 and FIG. 4B is an isometric view of the resistive heater 173 according to one embodiment.

The resistive heater 173 may be disposed in the plate member 146 and include an inner zone and outer zone as shown in FIG. 4A. Electrical leads 402 may extend through or around the plate member 148 for a connection to a power source (not shown).

As shown in FIG. 4B, the resistive heater 173 includes a first heater element 405 for the outer zone and a second heater element 410 for the inner zone. Electrical leads 415 may be used to couple the first heater element 405 to the power source and electrical leads 420 may be used to couple the second heater element 410 to the power source.

FIG. 4C is an isometric view of the plate member 146, which may be an aluminum plate, having a plurality of channels 425 formed therein. The channels 425 are sized to receive the first heater element 405 and the second heater element 410 of the resistive heater 173 shown in FIG. 4B. Also shown is a plurality of bolt holes 430 that are utilized to receive fasteners 152 shown in FIGS. 1 and 2.

Figure 5C:
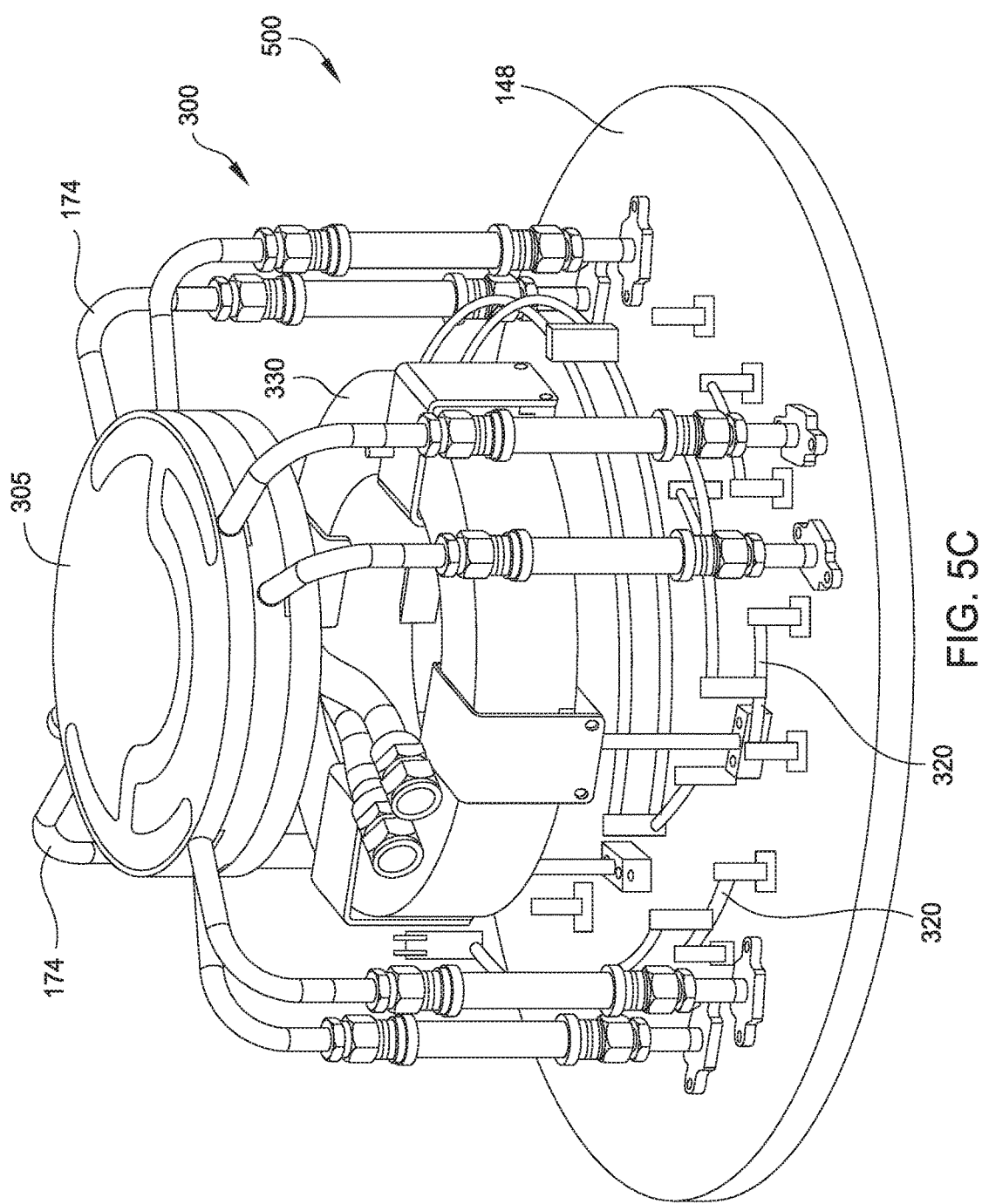
FIG. 5C is an isometric view of the recursive fluid system coupled to the plate member as a portion of the lid assembly of FIG. 3.

FIG. 5A is an isometric view of one embodiment of a recursive fluid system 500 that may be used with the gas distribution plate assembly 110 of FIG. 1 or the gas distribution plate assembly 200 of FIG. 2. FIG. 5B is a plan view of the recursive fluid system 500 of FIG. 5A. FIG. 5C is an isometric view of the recursive fluid system 500 coupled to the plate member 148 as a portion of the lid assembly 300 described in FIG. 3.

The recursive fluid system 500 include a plurality of supply conduits 505 and a plurality of return conduits 510 that are in fluid communication with the thermal control conduits 150A. Each of the plurality of supply conduits 505 are coupled to a supply channel 515 of the coolant plate 305. Likewise each of the plurality of return conduits 510 are coupled to a return channel 520 of the coolant plate 305.

FIG. 6A is a schematic cross-sectional view of a portion of a gas distribution plate assembly 600 showing on embodiment of branch conduits 214 formed in a base plate 210. FIG. 6B is an isometric top view of the base plate 210 of FIG. 6A. In this embodiment, each of the gas conduits 162 extend to a respective channel 605 formed in an upper surface 610 of the base plate 210. The branch conduits 214 are coupled between the channels 605 and the openings 160 of the perforated faceplate 125. In some embodiments, there are about 450 to about 500 channels 605 formed in the base plate 210.

Figure 7:
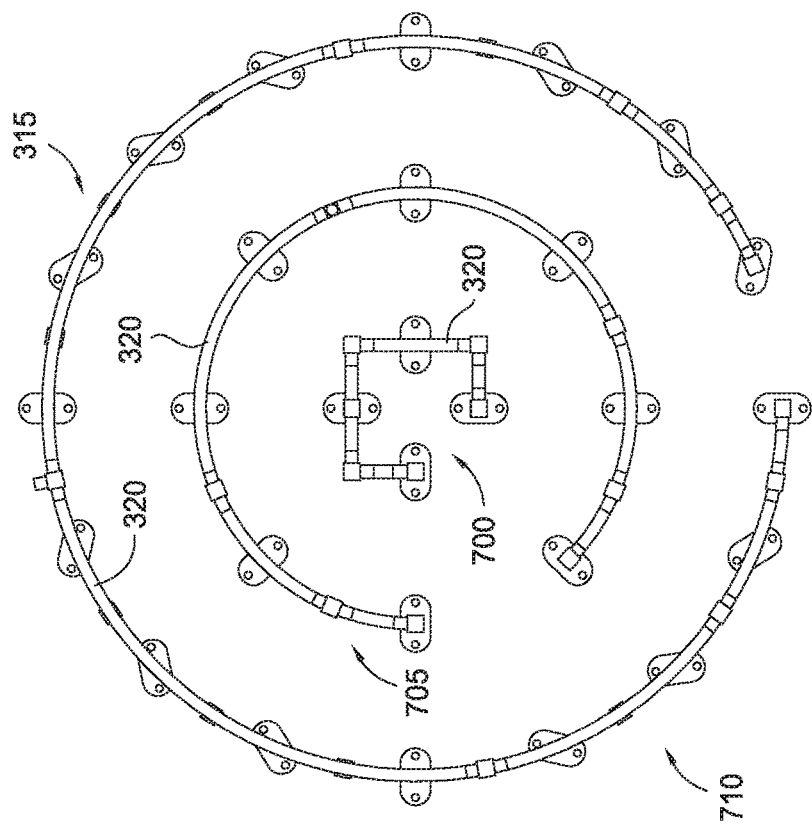
FIG. 7 is a top plan view of the process gas distribution system according to one embodiment.

FIG. 7 is a top plan view of the process gas distribution system 315 according to one embodiment. The process gas distribution system 315 may be utilized with any of the gas distribution plate assembly 110 of FIG. 1 or the gas distribution plate assembly 200 of FIG. 2. The process gas distribution system 315 includes gas lines 320 that are divided into a center delivery zone 700, an intermediate delivery zone 705 and an outer delivery zone 710. Each of the zones 700, 705 and 710 may be recursive as described herein.

Figure 8:
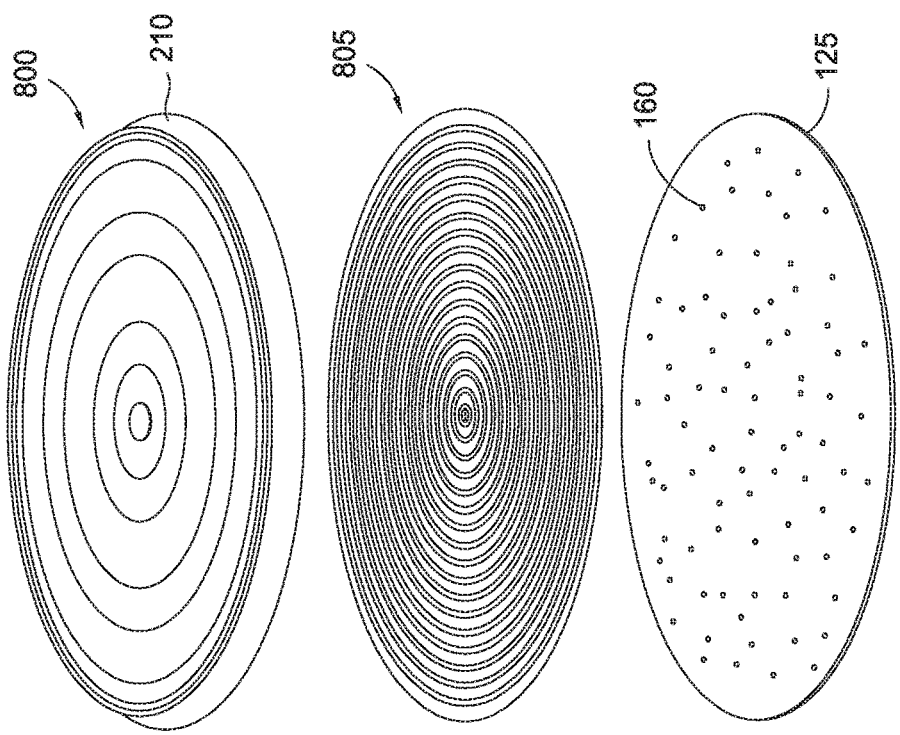
FIG. 8 is an isometric exploded view of a portion of a gas distribution plate assembly that may be used as the gas distribution plate assembly of FIG. 1 or the gas distribution plate assembly of FIG. 2.

FIG. 8 is an isometric exploded view of a portion of a gas distribution plate assembly 800 that may be used as the gas distribution plate assembly 110 of FIG. 1 or the gas distribution plate assembly 200 of FIG. 2. The gas distribution plate assembly 800 includes a base plate 210, which may be made of aluminum or a silicon infiltrated metal matrix composite as described herein. The gas distribution plate assembly 800 also includes a perforated faceplate 125 that may be coupled to the base plate 210 by a bond layer 805. The bond layer 805 may be an organic bonding material or a diffusion bond.

Figure 9:
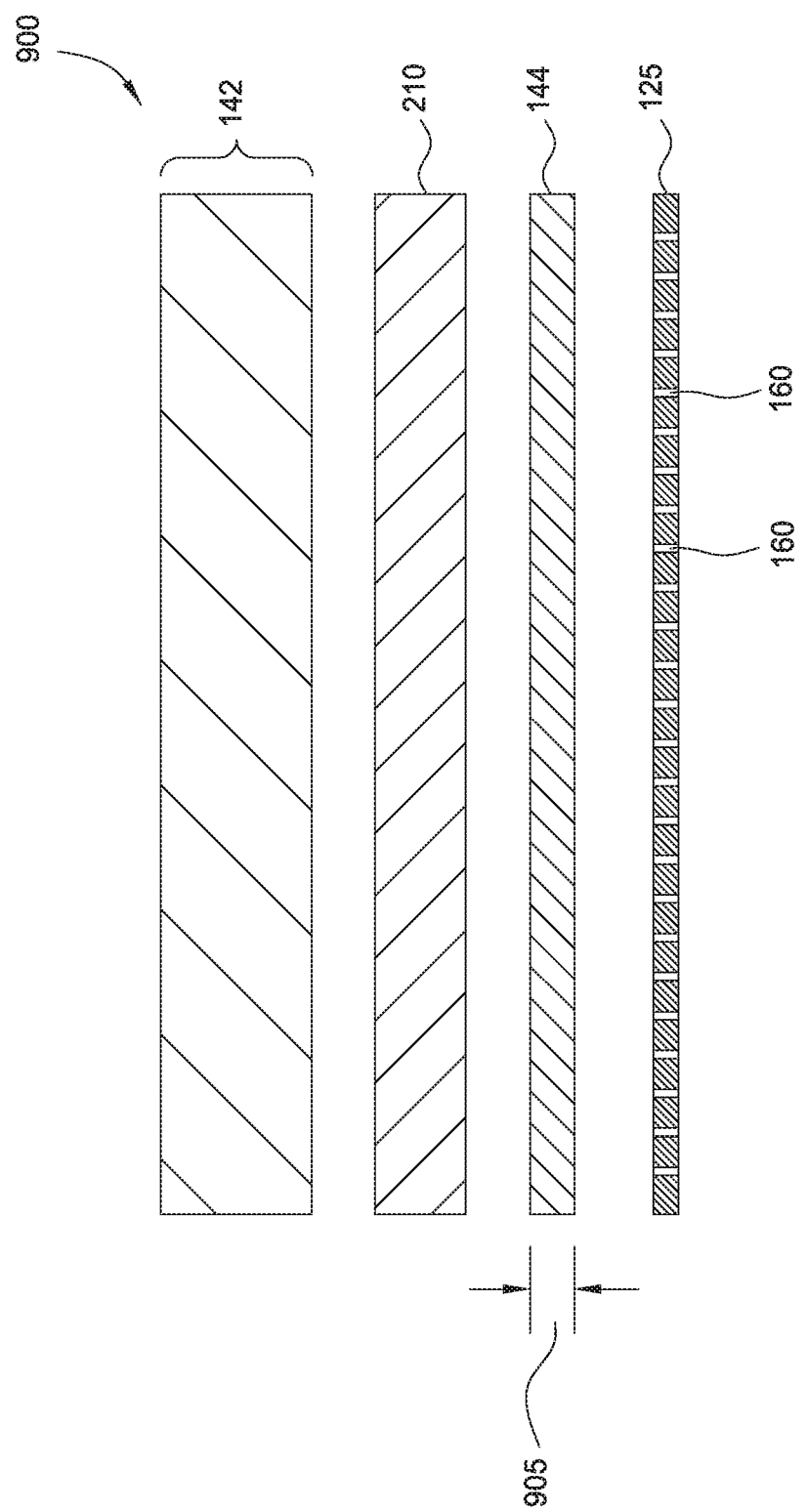
FIG. 9 is an exploded cross-sectional view of another embodiment of a gas distribution plate assembly that may be used as the gas distribution plate assembly of FIG. 1 or the gas distribution plate assembly of FIG. 2

FIG. 9 is an exploded cross-sectional view of another embodiment of a gas distribution plate assembly 900 that may be used as the gas distribution plate assembly 110 of FIG. 1 or the gas distribution plate assembly 200 of FIG. 2. The gas distribution plate assembly 900 includes a body 142. The body 142 may be made of aluminum and include the thermal control conduits 150A and 150B (not shown in FIG. 9). The gas distribution plate assembly 900 according to this embodiment includes a base plate 210 made of a SiSiC material as described herein. The base plate 210 may include the distribution channels 164 and/or the branch conduits 214 (both not shown) as described herein. The perforated faceplate 125 may be coupled to the base plate 210 by a bond layer 144. The bond layer 144 according to this embodiment is an aluminum (Al) or an aluminum/silicon alloy (AlSi) material. The bond layer 144 may be a diffusion bond. The bond layer 144 may be provided at about 550 degrees Celsius to about 600 degrees Celsius. The bond layer 144 may have a thickness 905 of about 10 mils (about 0.25 millimeters).

While the foregoing is directed to embodiments of the present disclosure, other and further embodiments of the disclosure may be devised without departing from the basic scope thereof, and the scope thereof is determined by the claims that follow.

The invention claimed is:

1. A gas distribution plate assembly, comprising:
    a base plate comprising a metal matrix composite and including a plurality of thermal control conduits formed therein;

a perforated faceplate comprising a silicon wafer coupled to the base plate by a bond layer, wherein the silicon wafer is doped to provide electrically conductive properties to the perforated faceplate, and wherein the bond layer includes a plurality of gas distribution channels formed therein that are coupled to gas conduit formed through the base plate, and wherein the base plate and the perforated faceplate have a similar thermal conductivity; and a temperature control system coupled to the gas distribution plate assembly, wherein the temperature control system comprises a fluid supply having a recursive tubing arrangement comprising a plurality of supply conduits and a plurality of return conduits each coupled to a respective one of the plurality of thermal control conduits formed in the base plate, wherein the plurality of supply conduits and the plurality of return conduits comprise a similar flow conductance.

2. The gas distribution plate assembly of claim 1, wherein the bond layer comprises an aluminum silicon alloy or an aluminum material.

3. The gas distribution plate assembly of claim 1, wherein the base plate comprises one of silicon, aluminum, or an aluminum silicon alloy in the metal matrix composite.

4. The gas distribution plate assembly of claim 1, wherein the bond layer comprises a diffusion bond.

5. The gas distribution plate assembly of claim 1, wherein a body comprising an aluminum material is coupled to the base plate, and the gas conduit is formed through the body.

6. The gas distribution plate assembly of claim 1, wherein the gas conduit comprises a plurality of branch conduits formed in the base plate.

7. A gas distribution plate assembly, comprising:
a body;
a recursive fluid supply coupled to a portion of the body, the recursive fluid supply comprising a plurality of coolant lines that are split into sections having an equal length and diameter;
a perforated faceplate comprising a silicon wafer coupled to the body by a base plate, wherein the silicon wafer is doped to provide electrically conductive properties to the perforated faceplate;
a bond layer disposed between the base plate and the perforated faceplate; and
a plurality of seals positioned at an interface between the body and the base plate.

8. The gas distribution plate assembly of claim 7, wherein the bond layer comprises an organic bond.

9. The gas distribution plate assembly of claim 7, wherein gas passages are formed in the base plate.

10. The gas distribution plate assembly of claim 7, wherein the base plate comprises a silicon infiltrated metal matrix composite.

11. The gas distribution plate assembly of claim 10, wherein gas passages are formed in the base plate and the bond layer.

12. The gas distribution plate assembly of claim 10, wherein the perforated faceplate is diffusion bonded to the bond layer.

13. The gas distribution plate assembly of claim 10, wherein the bond layer is in contact with the base plate and the perforated faceplate.

14. The gas distribution plate assembly of claim 10, wherein a thermal gasket is disposed between the body and the base plate.

15. A processing chamber, comprising:
a gas distribution plate assembly, comprising:
a base plate comprising a metal matrix composite; and
a perforated faceplate comprising a silicon wafer coupled to the base plate by a bond layer, wherein the bond layer includes a plurality of gas distribution channels formed therein that are coupled to gas conduit formed through the base plate; and
a temperature control system coupled to the gas distribution plate assembly, wherein the temperature control system comprises a fluid supply having a recursive tubing arrangement comprising a plurality of supply conduits and a plurality of return conduits each coupled to a respective one of the plurality of thermal control conduits formed in the base plate, wherein recursive tubing arrangement comprises a plurality of tubes with a similar flow conductance.

16. The processing chamber of claim 15, wherein each of the plurality of supply conduits and the plurality of return conduits are formed in a plate coupled to the base plate.

17. The processing chamber of claim 15, further comprising a heater positioned in the base plate.

18. The processing chamber of claim 15, wherein the base plate comprises one of silicon, aluminum, or an aluminum silicon alloy in the metal matrix composite.

* * * * *